US012696422B2

(12) United States Patent　　　(10) Patent No.:　US 12,696,422 B2
Badie et al.　　　(45) Date of Patent:　　Jul. 28, 2026

(54) THERMAL MITIGATION DEVICE FOR APPLICATION IN RADIO BATTERIES AND/OR ADAPTORS AND METHODS OF USE THEREOF

(71) Applicant: THALES DEFENSE & SECURITY, INC., Clarksburg, MD (US)

(72) Inventors: Mehrdad Badie, North Potomac, MD (US); Douglas Bell, North Potomac, MD (US); Steven Kutchi, Ijamsville, MD (US)

(73) Assignee: THALES DEFENSE & SECURITY, INC., Clarksburg, MD (US)

( * ) Notice: Subject to any disclaimer, the term of this patent is extended or adjusted under 35 U.S.C. 154(b) by 256 days.

(21) Appl. No.: 18/303,368

(22) Filed: Apr. 19, 2023

(65) Prior Publication Data

US 2023/0254993 A1　　Aug. 10, 2023

Related U.S. Application Data

(63) Continuation of application No. 17/200,505, filed on Mar. 12, 2021, now Pat. No. 11,665,854.
(Continued)

(51) Int. Cl.
H05K 7/20　　　(2006.01)
(52) U.S. Cl.
CPC ..... H05K 7/20209 (2013.01); H05K 7/20145 (2013.01); H05K 7/2039 (2013.01)
(58) Field of Classification Search
CPC ........... H05K 7/20145; H05K 7/20209; H05K 7/20154; H05K 7/20545; H05K 7/2089;
(Continued)

(56) References Cited

U.S. PATENT DOCUMENTS

| 5,898,569 | A | 4/1999 | Bhatia |
| 7,375,967 | B2 | 5/2008 | Huang et al. |
| | | (Continued) | |

FOREIGN PATENT DOCUMENTS

| CN | 103336564 A | * 10/2013 |
| CN | 103336565 | * 10/2013 |
| | (Continued) | |

OTHER PUBLICATIONS

English translation of CN 207010302U Portable 220V Alternating Current Power Supply (Year: 2018).

*Primary Examiner* — Mandeep S Buttar
(74) *Attorney, Agent, or Firm* — ArentFox Schiff LLP

(57) ABSTRACT

A portable radio device incorporating active thermal mitigation systems, and methods of use thereof. An example radio device incorporating an active thermal mitigation system may comprise a portable radio device selectively connectable or otherwise interoperable with a power adapter or battery device, wherein the power adapter or battery device includes an active thermal mitigation system. The system may include a micro-fan, blower, or other similar device configured to generate airflow, and may be configured to direct a flow of air or other fluid towards the radio device. The system may further include one or more fins or other features for directing and/or enhancing fluid flow, as well as sensors and control features to vary flow depending on temperature of the radio device or other variables.

19 Claims, 4 Drawing Sheets

Related U.S. Application Data

(60) Provisional application No. 63/000,957, filed on Mar. 27, 2020.

(58) Field of Classification Search
CPC ...... G06F 1/206; G06F 1/20; G06F 2200/202; G06F 2200/201
USPC ......................................................... 361/697
See application file for complete search history.

(56) References Cited

U.S. PATENT DOCUMENTS

| | | | | |
|---|---|---|---|---|
| 7,472,215 | B1 | 12/2008 | Mok et al. | |
| 10,248,167 | B1 * | 4/2019 | Huang ................... | G06F 1/1656 |
| 2003/0058615 | A1 * | 3/2003 | Becker .................... | G06F 1/203 |
| | | | | 361/679.48 |
| 2009/0113228 | A1 * | 4/2009 | Mok ...................... | G06F 1/3203 |
| | | | | 713/323 |
| 2010/0270188 | A1 * | 10/2010 | Dotson .................. | A45C 11/00 |
| | | | | 165/47 |
| 2017/0090531 | A1 * | 3/2017 | Forbes ...................... | G06F 1/26 |
| 2021/0258031 | A1 | 8/2021 | Ostrin et al. | |
| 2021/0345520 | A1 | 11/2021 | Los et al. | |

FOREIGN PATENT DOCUMENTS

| | | | | |
|---|---|---|---|---|
| CN | 207010302 | U | 2/2018 | |
| JP | 2006085422 | * | 3/2006 | |
| JP | 2006085422 | A * | 3/2006 | ......... H05K 7/20145 |

* cited by examiner

THERMAL MITIGATION DEVICE FOR APPLICATION IN RADIO BATTERIES AND/OR ADAPTORS AND METHODS OF USE THEREOF

CROSS-REFERENCE TO RELATED APPLICATIONS

The current application is a continuation of U.S. patent application Ser. No. 17/200,505, filed Mar. 12, 2021, which claims priority to and the benefit of U.S. Provisional Application No. 63/000,957 filed on Mar. 27, 2020, entitled "A Thermal Mitigation Device for Application in Radio Batteries and/or Adaptors and Methods of Use Thereof," the contents of which are hereby incorporated by reference in their entirety.

TECHNICAL FIELD

Aspects of the present disclosure are directed to thermal mitigation or thermal regulation devices for application in wireless devices, and methods use thereof.

BACKGROUND

This background and summary are provided to introduce a selection of concepts in a simplified form that are further described below in the DETAILED DESCRIPTION. This background and summary are not intended to identify key features of the claimed subject matter, nor is it intended to be used as an aid in determining the scope of the claimed subject matter.

Developed in the late 19th and early 20th centuries, wireless radio devices revolutionized communication among people over distances by facilitating the wireless transmission of information, messages, and other related data over electromagnetic waves, for example, within radio frequencies between 30 hertz (Hz) and 300 gigahertz (GHz). Since the radio device was introduced to the battlefield in World War 1, radio technology has become increasingly more reliable, compact, and robust, and thus continued to enhance human capacity for communication and coordination both in times of war and in times of peace.

Long removed from the early prototypes that required horses and mules for transport, the modern radio device is now sufficiently compact for hand-held use. Consequent of such a condensed configuration, the modern radio device necessarily incorporates a plurality of components into a small physical space. Such components historically have included transmitters configured to transmit a modulated radio signal, receivers configured to receive modulated radio signals from another transmitting radio device, and batteries, power adapters, or similar power sources attached to the bottom of the radio device, such that the radio device may be powered when in mobile use.

However, because radio devices of the related art rely on components needing power, such as transmitters configured to transmit a modulated radio signal, and receivers configured to receive modulated radio signals from another transmitting radio device, and batteries, power adapters, or similar power sources must be attached to or contained within the radio device in order for the radio device to be powered when in mobile use, a radio device requires significant power to successfully operate. Consequently, radio devices of the related art often become exceedingly hot during operation. This increase in temperature may result in discomfort or injury to the user of the radio device if the device becomes sufficiently hot during its operation. Additionally, this increase in temperature may also result in damage to both the physical radio device and the components contained therein. However, because these radio devices are constrained in size by their need to remain portable, portable radio devices in use in the related art are not able to incorporate effective active thermal management systems. Although there have been some attempts in the related art to implement different temperature mitigating methods, such as placing heat shields in high temperature areas, implementing more power-efficient designs, or using metal batteries or adapters, hand-held radio devices still frequently exceed touch temperature limits.

Thus, there remains an unmet need in the related art for a portable radio device that incorporates an efficient active thermal mitigation system so that a portable radio device may remain at or below touch temperature limits for extended periods of time during operation.

Consequent of the deficiencies described above, as well as others, there remains an unmet need for a radio device that incorporates an efficient active thermal mitigation system so that the radio device may remain at or below touch temperature limits for extended periods of time during operation.

SUMMARY

In view of the above problems and shortcomings, as well as others, aspects of the present disclosure relate to, among other things, portable wireless devices incorporating active thermal mitigation systems, and methods of use thereof. According to various aspects, the portable radio device incorporating an active thermal mitigation system of the present disclosure may comprise a portable radio device selectively connectable with a power adapter or battery device, wherein the power adapter or battery device comprises an active thermal mitigation system. The active thermal mitigation system may be comprised of a micro-fan, blower, or other similar device configured to generate airflow, and may be configured to direct the aforementioned air flow at the selectively connected radio device, allowing for the continuous cooling the radio device via convection without requiring the incorporation of the active thermal mitigation system within the radio device itself. The system may further include one or more fins or other features for directing and/or enhancing fluid flow, as well as sensors and control features to vary flow depending on temperature of the radio device or other variables. Thus, the system may allow for continuous cooling of the radio device via convection without requiring the incorporation of the active thermal mitigation system within the radio device.

Additional advantages and novel features of these aspects will be set forth in part in the description that follows, and in part will become more apparent to those skilled in the art upon examination of the following or upon learning by practice of the disclosure.

BRIEF DESCRIPTION OF THE DRAWINGS

The novel features believed to be characteristic of implementations of the disclosure are set forth in the appended claims. In the descriptions that follow, like parts are marked throughout the specification and drawings with the same numerals, respectively. The drawing figures are not necessarily drawn to scale and certain figures may be shown in exaggerated or generalized form in the interest of clarity and conciseness. The disclosure itself, however, as well as a preferred mode of use, further features and advances thereof, will be best understood by reference to the following detailed description of illustrative implementations of the disclosure when read in conjunction with the accompanying drawings, wherein:

DETAILED DESCRIPTION

Figure 1:
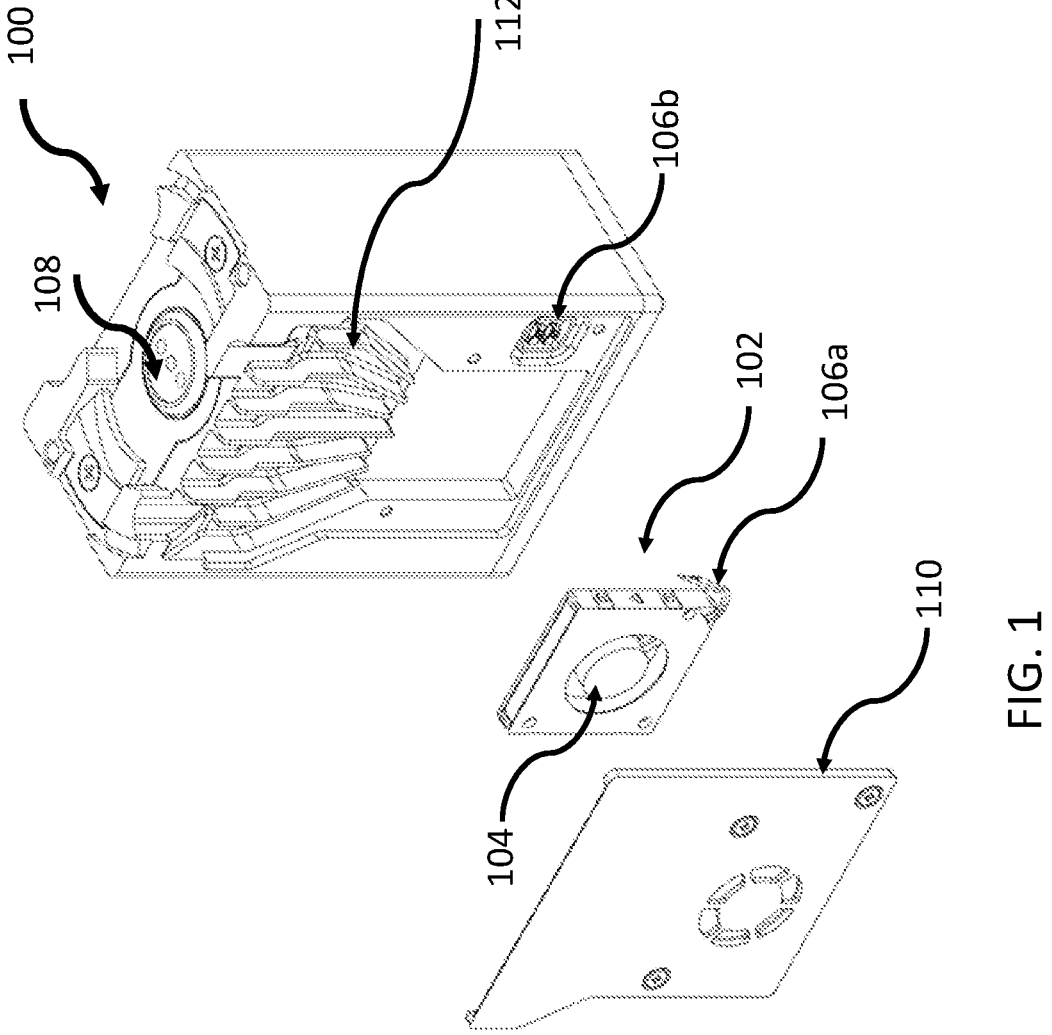
FIG. 1 illustrates an exploded perspective view of an example power adapter or battery device incorporating a thermal mitigation system, according to aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

A "radio device," as used herein, may be any form of a wireless device operating on radio signals, for example, a mobile telephone, a radio device, a personal digital assistant ("PDA"), and may not be limited to a specific radio device.

Aspects of the present disclosure relate to methods and systems for thermoregulation of radio devices. These methods, apparatuses, and media will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall implementation.

By way of example, an element, or any portion of an element, or any combination of elements may be implemented with a 'processing system' that includes one or more processors. Examples of processors include microprocessors, microcontrollers, digital signal processors (DSPs), field programmable gate arrays (FPGAs), programmable logic devices (PLDs), state machines, gated logic, discrete hardware circuits, discrete radio frequency (RF) circuits, and other suitable hardware configured to perform the various functionality described throughout this disclosure. Once or move processors in the processing system may execute software. Software shall be construed broadly herein to include instructions, instruction sets, code, conde segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, firmware, or any combination thereof. If implemented in software, the functions may be stored on or encoded as one or more instructions or code on a computer-readable medium or media. Computer-readable media includes computer storage media. Storage media may be any available media that is able to be accessed by a computer. By way of example, and not limitation, such computer-readable media can comprise a random-access memory (RAM), a read-only memory (ROM), an electrically erasable programmable ROM (EEPROM), compact disk ROM (CD-ROM) or other optical disk storage, magnetic disk storage or other magnetic storage devices, or any other medium that may be used to carry or store desired program code in the form of instructions or data structures and that may be accessed by a computer. Disk and disc, as used herein, include CD, laser disc, optical disc, digital versatile disc (DVD), and floppy disk, where disks usually reproduce data magnetically, while discs reproduce data optically with lasers. Combinations of the above should also be included within the scope of computer-readable media.

FIG. 1, according to aspects of the present disclosure, illustrates in a perspective view of an example power device 100, in accordance with aspects of the present disclosure. The power device 100 may be selectively connectable to a communication device, such as radio device 306, illustrated in FIG. 3. In one example implementation, the power device 100 may be or include a power adapter device, allowing the radio device to be powered by any connected ancillary battery powered equipment. For example, the power device 100 may be connected to an ancillary battery powered equipment (not illustrated in FIG. 1) via a connection line. The ancillary battery powered equipment may be or include, for example, a wall outlet or a separate battery. In another example, the power device 100 may be a radio battery or any device that holds electric charge for powering a radio device. Further, the power device 100 may be configured to include a twist-lock matably engageable with a standard JEM/MBITR (Joint Tactical Radio System Enhanced/Multiband Inter/Intra Team Radio) battery. The power device may be connectable via a connection port 108.

According to various aspects, the power device 100 (hereinafter also referred to interchangeably, "a power source") may incorporate an active thermal mitigation system 102. The active thermal mitigation system 102 may further include a thermoregulation device 104. The thermoregulation device 104 may be configured to generate airflow. The thermoregulation device 104 may comprise a micro-fan, blower, or similar device configured to facilitate the movement of fluid, such as ambient air. According to various aspects of the present disclosure, the active thermal mitigation system 102 may be configured to cool or regulate the temperature of the device to which it is connected, for example, the battery, rather than to the device in which it is installed, for example, the radio device. However, in another example, the active thermal mitigation system 102 may be configured to cool or regulate both the temperature of the device to which it is connected (e.g., the battery), and of the device in which it is installed (e.g., the radio device), contemporaneously.

In one aspect of the disclosure, the active thermal mitigation system 102 may comprise a cover 110. The cover 110 may border and/or abut and/or otherwise be located proximal to the communication device for which the active thermal mitigation system 102 may be used to regulate temperature. For example, the active thermal mitigation system 102 may be powered by the power device 100 via a connection 106*a* located on the thermoregulation device 104, engageable with (e.g., capable of being connected to) a corresponding connection 106*b* located on the power device 100. The thermal mitigation system 102 may provide airflow to the communication device (not illustrated) and/or power device 100, as discussed in further detail below.

Active thermal mitigation system 102 may be installed within power device 100, as illustrated in FIG. 1. Alternatively, for example, the active thermal mitigation system 102 may be installed in a plurality of locations both within and on the surface of power device 100. The placement of the active thermal mitigation system 102 shown in FIG. 1 is merely illustrative, and is not meant to be restrictive.

According to another aspect of the disclosure, the power device may contain one or more venting gills 112. The venting gills 112 may provide a channel to direct the flow of air from the thermal mitigation system 102 to various portions of the power device 100 and the radio device. The flow of air from the venting gills 112 may provide additional surface area to regulate the temperature of the communication device (not illustrated in FIG. 1) and/or power device 100, as discussed in further detail below. In another aspect of the disclosure, the venting gills 112 may also comprise a heat sink. The heat sink may be or include a passive heat exchanger that transfers the heat generated by the power device 100 and/or radio device to the air generated by the thermal mitigation system 102. The heat may be dissipated away from the power device 100 and/or the radio device, thereby allowing regulation of the temperature of either or both devices at optimal levels. These optimal levels standards may be set by safety setting bodies, for example, Underwriters Laboratories® ("UL").

Figure 2:
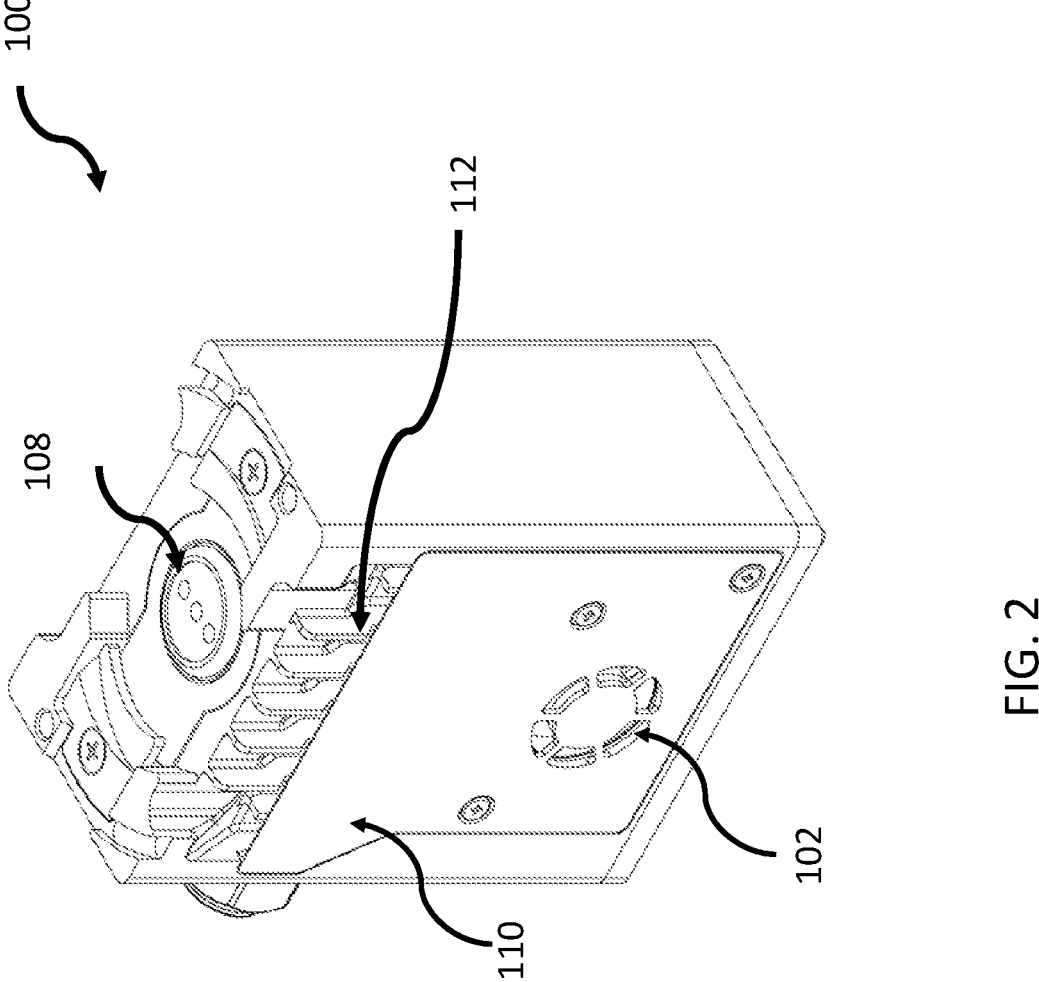
FIG. 2 illustrates a perspective view of an assembled power adapter or battery device employing an active thermal mitigation system, according to aspects of the present disclosure.

According to various aspects of the present disclosure, FIG. 2 illustrates an assembled view of the power device 100 of FIG. 1. The assembled power device 100 may incorporate an active thermal mitigation system 102. The active thermal mitigation system 102 may be comprised of the thermoregulation device 104 of FIG. 1. The thermoregulation device 104 (FIG. 1) may comprise a micro-fan, blower, or similar device configured to facilitate the movement of air or generate an airflow. In one example, the generated air flow may be further directed to or toward an attached or otherwise proximally located radio devices, thereby reducing the surface temperature of the radio device via convection. In another example, the generated air flow may indirectly draw a flow of air relative to a radio device, so as also reducing the surface temperature such as via convection. The power device 100 shown in FIG. 2 is only one example implementation of an active thermal mitigation system 102 in accordance with aspects of the present disclosure, as the active thermal mitigation system 102 may also be configured in other ways to provide directional airflow to the selectively connectable radio device from a short distance. Further, incorporation of active thermal mitigation system 102 within power device 100 also allows for selective or optional incorporation cooling within the overall radio system, such as radio device 306, illustrated in FIG. 3. For example, if it is determined in a particular situation that a radio system will not reach sufficiently high thermal temperatures due to environmental conditions or planned duration of operation, a smaller battery or power adapter without active thermal mitigation system 102 may be readily employed as a substitute to power device 100. Thus, choice in weight and portability of a radio system is maintained, while also permitting the selective incorporation of an active thermal mitigation system, such as active thermal mitigation system 102, as described above.

Figure 3:
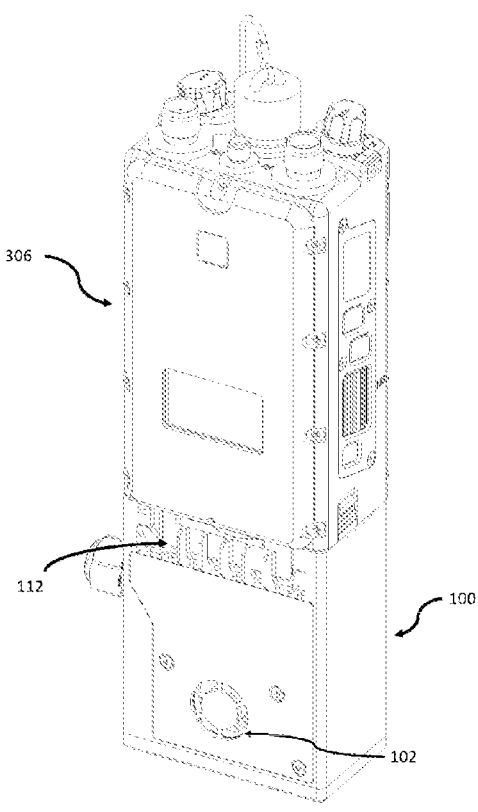
FIG. 3 illustrates a perspective view of an assembled device employing an active thermal mitigation system selectively connected to a radio device, according to aspects of the present disclosure.

Similar to FIG. 2, FIG. 3 illustrates a power device 100 employing an active thermal mitigation system 102, while also illustrating a radio device 306 selectively connectable to power device 100, in accordance with aspects of the present disclosure. Radio device 306 may include various components for receiving, processing, and transmitting a radio frequency (RF) signal, such as a radio frequency amplifier, mixer, variable frequency oscillator, intermediate frequency amplifier, detector, and/or audio amplifier (e.g., the handheld radio JEM, made by Thales Communications, Inc., of Clarksburg, MD). In an alternate example, radio device 300 may include various components for receiving and transmitting communication signals using a first radio technology, such as, Very High Frequency (VHF), Ultra High Frequency (UHF), L-B and, a legacy military waveform, or a narrowband voice channel.

In FIG. 3, radio device 306 is shown in an example configuration wherein radio device 306 may interoperate with power device 100. In one example, the interoperation between radio device 306 and power device 100 may be facilitated by the interaction of a threaded fasteners, such as a screw or rivet (not visible in FIG. 3), and a corresponding mounting feature, such as a threaded opening (not visible in FIG. 3). In one variation, the threaded connector may be configured to be incorporated with power device 100, such that power device 100 may connect to the mounting feature incorporated into radio device 306. However, in an alternative example the opposite may be true. In this alternative example, the threaded connector may be incorporated into radio device 306, wherein connector may interoperate with the mounting feature incorporated in power device 100.

In yet another example implementation, a threaded connector-mounting feature may need not be implemented. For example, radio device 306 may be fastenably interoperable with power device 100 via a system of snap engaging features or other similar securing members. The system of snap engaging features may include a plurality of snap receiving features mounted to radio device 306, and a corresponding plurality of snap engaging features positioned within power device 100, such that when snap engaging features are aligned with and then pressed against snap receiving features, snap engaging features may fastenably engage snap receiving features. Consequently, radio device 306 may be secured to and interoperable with power device 100. Further, in another example radio device 306 may be configured to include the snap engaging features and power device 100 may include the snap receiving features. In yet another example, either power device 100 or radio device 306 may be configured to include a twist-lock, wherein the twist lock may be matably engageable with the converse not configured with the twist-lock.

As described above, in one aspect of the disclosure, in operation, the venting gills 112 may direct a flow of air from the active thermal mitigation system 102 to the radio device 306. In another aspect of the disclosure, the venting gills 112 may provide, via a suction action, a flow of air from the radio device 306 towards the active thermal mitigation system 102. In both of these aspects described above, the temperature and heat from the radio device 306 and the power device 100 may be reduced by the active movement of air in either direction.

Figure 4:
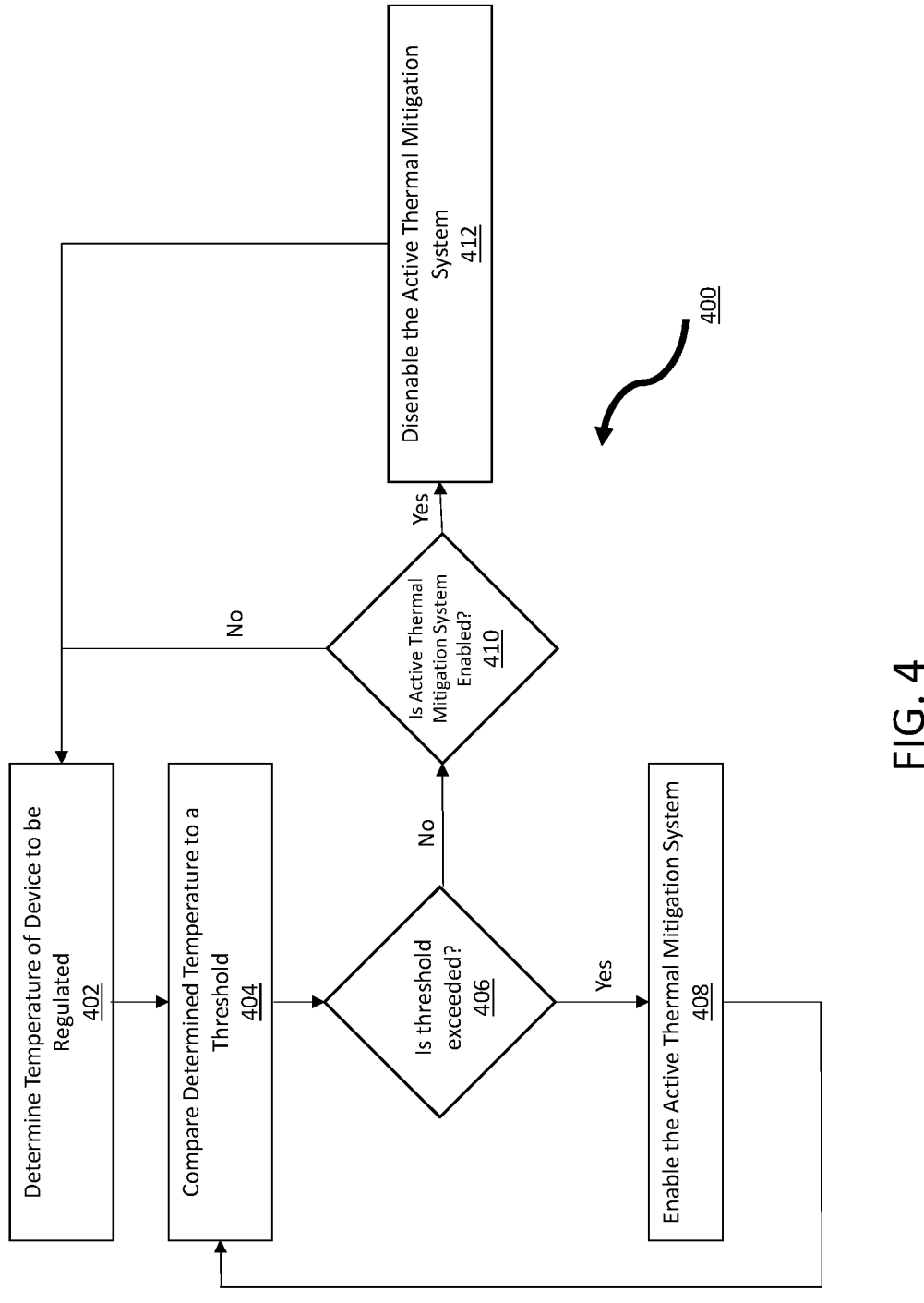
FIG. 4 illustrates a flowchart of a process for one example implementation for active thermal mitigation in accordance with aspects of the present disclosure.

FIG. 4 illustrates a flowchart 400 of an example method for implementation of active thermal mitigation in accordance with aspects of the present disclosure. For example, as described above with regard to FIGS. 1-3, the radio device 306 and/or power device 100 may require thermal mitigation to allow operation within regulated optimal temperature levels. As shown in FIG. 4, at block 402, the active thermal mitigation system may acquire and determine the temperature of a device to be temperature regulated. For example, as shown in FIG. 3, the temperature of the radio device 306 and/or power device 100 may be determined. This temperature may be determined, for example, via a temperature sensor or other suitable device that may measure temperature. The active thermal mitigation process may run constantly, or may be set to start at predetermined or preset intervals. In one example, the interval may be configured to be every 10 seconds. However, in another example the interval may be configured to be every 30 seconds, or every 60 seconds. In another aspect of the disclosure, the intervals may differ depending on whether the active thermal mitigation system (e.g., system 102 of FIG. 1) is enabled (e.g., if the threshold is exceeded for one or more successive intervals, the interval may be increased). Thus, variation of the processing intervals may thereby provide for an overall power saving function of the power device 100, for example by reducing processor operation.

At block 404, the determined temperature of the device to be regulated may be compared with a threshold value. As described above, the threshold value may be pre-determined by UL or any other standard setting body. In another aspect of the disclosure, the threshold value may be determined based upon levels that may damage the device or cause injury to a user, for example. This threshold may also be set by the manufacturer of the device based on other relevant criteria, such as component life.

At block 406, a determination is made as to whether the threshold is exceeded. If the threshold is exceeded, the process moves to block 408. If the threshold is not exceeded, the process moves to block 410.

At block 408, in the event the threshold is exceeded, the device causes or continues enablement of operation of the active thermal mitigation system (e.g., system 102 of FIG. 1). The process then returns to block 402 re-determine temperature of the device to be regulated.

In the even the threshold is not exceeded in block 406, the method proceeds to block 410, wherein the device determines if the active thermal mitigation system (e.g., system 102 of FIG. 1) is already enabled. If the device determines the active thermal mitigation system is not enabled, the process then returns to block 402 to re-determine the temperature of the device to be regulated. If at block 410, it is determined that the active thermal mitigation system (e.g., system 102 of FIG. 1) is already enabled, the process moves to block 412. At block 412, the device disenables the active thermal mitigation system. The process then starts over again at block 402.

The process may run constantly or may be set to start at predetermined or preset intervals. For example, the intervals may be every 10 seconds, every 30 seconds, every minute, etc. In another aspect of the disclosure, the intervals may differ depending on whether the active thermal mitigation system (e.g., system 102 of FIG. 1) is enabled (e.g., if the threshold is exceeded for one or more successive intervals, the interval may be increased). Variation of the processing intervals may thereby provide for an overall power saving function of the power device 100 (e.g., by reducing processor operation).

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Thus, the claims are not intended to be limited to the aspects shown herein, but are to be accorded the full scope consistent with the language of the claims, wherein reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Further, the word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. Nothing disclosed herein is intended to be dedicated to the public regardless of whether such disclosure is explicitly recited in the claims.

The invention claimed is:

1. A portable communication device, comprising:
 a wireless communication device configured to operate via electrical energy provided by a battery;
 the battery selectively connectable and selectively interoperable with the wireless communication device;
 an active thermal mitigation system comprising a fan, a micro-fan, or a blower configured to provide an air flow; and
 one or more venting gills configured to direct the air flow from the active thermal mitigation system toward at least one of the wireless communication device or the battery,
 wherein the battery further comprises a temperature sensor configured to determine a temperature of the portable communication device.

2. The portable communication device of claim 1, wherein the one or more venting gills comprises a heat sink.

3. The portable communication device of claim 1, wherein the fan, the micro-fan, or the blower is further configured to cause movement of the air flow within at least one of the wireless communication device or the battery.

4. The portable communication device of claim 1, wherein the battery is further configured to enable the active thermal mitigation system in response to the temperature exceeding a threshold temperature.

5. The portable communication device of claim 1, wherein the active thermal mitigation system is configured to periodically activate the fan, the micro-fan, or the blower at an interval.

6. The portable communication device of claim 1, wherein the battery further includes a power adapter connector.

7. A method of implementation of active thermal mitigation by an active thermal mitigation system, comprising: providing, via a battery, electrical energy to a wireless communication device that is selectively connectable to the active thermal mitigation system; wherein the battery further comprises a temperature sensor configured to determine, a temperature of the wireless communication device; comparing the determined temperature to a threshold temperature; and enabling, in response to the determined temperature exceeding the threshold temperature, the active thermal mitigation system to provide a directional air flow toward at least one of the wireless communication device or the battery via one or more venting gills, wherein the active thermal mitigation system comprising a fan, a micro-fan, or a blower.

8. The method of claim 7, further comprising:
determining a second temperature of the wireless communication device; and
comparing the determined second temperature to the threshold temperature.

9. The method of claim 8, further comprising:
continuing, in response to the determined second temperature exceeding the threshold temperature, the enablement of the active thermal mitigation system.

10. The method of claim 8, further comprising:
disabling, in response to the determined second temperature being less than the threshold temperature, the active thermal mitigation system.

11. The method of claim 7, wherein the threshold temperature is determined based on temperature levels that may damage the wireless communication device or cause injury to a user.

12. The method of claim 7, further comprising periodically enabling and disabling the active thermal mitigation system.

13. The method of claim 12, wherein periodically enabling and disabling the active thermal mitigation system comprising enabling and disabling at a pre-determined intervals of less than 30 seconds.

14. A communication device comprising:
a wireless communication device configured to operate via electrical energy provided by a battery;
the battery selectively connectable and selectively interoperable with the wireless communication device; and
an active thermal mitigation system configured to provide an air flow to one or more of the wireless communication device or the battery via one or more venting gills,
wherein the battery further comprises a temperature sensor configured to determine a temperature of the communication device.

15. The communication device of claim 14, wherein the active thermal mitigation system comprises a fan, micro-fan, or blower.

16. The communication device of claim 15, wherein the fan, micro-fan or blower is configured to cause movement of the air flow within the wireless communication device.

17. The communication device of claim 15, wherein the fan, micro-fan or blower is configured to cause movement of the air flow within the battery.

18. The communication device of claim 14, further comprises the one or more venting gills.

19. The communication device of claim 14, wherein the battery further includes a power adapter connector.

* * * * *